(12) United States Patent
Zhang et al.

(10) Patent No.: US 11,923,384 B2
(45) Date of Patent: Mar. 5, 2024

(54) DISPLAY PANEL, MANUFACTURING METHOD THEREOF, AND DISPLAY DEVICE

(71) Applicant: Shenzhen China Star Optoelectronics Semiconductor Display Technology Co., Ltd., Shenzhen (CN)

(72) Inventors: Yu Zhang, Shenzhen (CN); Miao Jiang, Shenzhen (CN); Jiangbo Yao, Shenzhen (CN); Lixuan Chen, Shenzhen (CN); Xin Zhang, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 16/973,486

(22) PCT Filed: Nov. 19, 2020

(86) PCT No.: PCT/CN2020/130063
§ 371 (c)(1),
(2) Date: Dec. 9, 2020

(87) PCT Pub. No.: WO2022/052305
PCT Pub. Date: Mar. 17, 2022

(65) Prior Publication Data
US 2023/0207580 A1   Jun. 29, 2023

(30) Foreign Application Priority Data
Sep. 10, 2020 (CN) .................. 202010946960.2

(51) Int. Cl.
*H01L 27/144* (2006.01)
*H10K 59/60* (2023.01)
(Continued)

(52) U.S. Cl.
CPC ......... *H01L 27/1443* (2013.01); *H10K 59/60* (2023.02); *H01L 25/167* (2013.01); *H10K 59/12* (2023.02)

(58) Field of Classification Search
CPC ............... H01L 27/1443; H01L 25/167; H01L 27/1225; H01L 27/1259; H01L 25/0753;
(Continued)

(56) References Cited

U.S. PATENT DOCUMENTS

2010/0066646 A1* 3/2010 Ota .................. G09G 3/3648
345/9
2016/0282975 A1 9/2016 Wu et al.
(Continued)

FOREIGN PATENT DOCUMENTS

CN   104679356 A   6/2015
CN   104699344 A   6/2015
(Continued)

OTHER PUBLICATIONS

Zhang et al. ("High-Mobility Flexible Oxyselenide Thin-Film Transistors Prepared by a Solution-Assisted Method," J. Am. Soc, 142, pp. 2726-2731, Jan. 2020), (Year: 2020).*
(Continued)

*Primary Examiner* — Yasser A Abdelaziez
(74) *Attorney, Agent, or Firm* — Nathan & Associates; Menachem Nathan

(57) ABSTRACT

The present disclosure provides a display panel, a manufacturing method thereof, and a display device. The display panel includes a first transistor. The first transistor includes a first semiconductor layer, and the first semiconductor layer includes bismuth selenium oxide materials to enhance mobility of the first transistor and improve electrical performance of the display panel, so that the display panel meets requirements of high refresh rate and high transmittance.

16 Claims, 4 Drawing Sheets

(51) Int. Cl.
*H01L 25/16* (2023.01)
*H10K 59/12* (2023.01)

(58) Field of Classification Search
CPC ........ H01L 33/62; H10K 59/60; H10K 59/12; H10K 59/1213; H10K 59/1201
See application file for complete search history.

(56) References Cited

U.S. PATENT DOCUMENTS

2016/0291714 A1* 10/2016 Wu .................. H01L 31/02164
2017/0220194 A1    8/2017 Wu
2020/0043406 A1*  2/2020 Cha ..................... G09G 3/3283

FOREIGN PATENT DOCUMENTS

| CN | 105044952 A | 11/2015 |
| CN | 106011783 A | 10/2016 |
| CN | 111463295 A | 7/2020 |

OTHER PUBLICATIONS

Journal of the American Chemical Society No. 142 vol. No. 6 Congcong Zhang, etc. «High-mobility Flexible Oxyselenide Thin-film Transistors Prepared by Solution-assisted Method».

* cited by examiner

DISPLAY PANEL, MANUFACTURING METHOD THEREOF, AND DISPLAY DEVICE

BACKGROUND OF INVENTION

Field of Invention

The present disclosure relates to the field of display technology, and specifically to a display panel, a manufacturing method thereof, and a display device.

Description of Prior Art

In backplates of existing display devices, transistors including silicon semiconductor layers are often used. When the display devices high refresh rate, high transmittance requirements, etc., performance of the transistors will be insufficient, and higher-performance devices need to be developed to meet the requirements of display devices for high refresh rate and high transmittance, etc.

The present disclosure provides a display panel, a manufacturing method thereof, and a display device, which can enhance mobility of transistors and meet the requirements of the display panel for high refresh rate, high transmittance, etc.

SUMMARY OF INVENTION

The embodiment of the present disclosure provides a display panel, comprising: a first transistor, the first transistor comprising a first semiconductor layer, and the first semiconductor layer comprising a bismuth selenium oxide material.

In some embodiments, the display panel comprises a photosensitive detection unit, and the photosensitive detection unit comprises:

a second transistor comprising a second semiconductor layer, the second transistor is configured to convert an optical signal into an electrical signal; and the first transistor is configured to derive the electrical signal.

In some embodiments, the second transistor further comprises a photosensitive layer located on a side of the second semiconductor layer close to a light-emitting surface of the display panel, and the second semiconductor layer comprises one of silicon material, oxide materials, or bismuth selenium oxide materials.

In some embodiments, the second semiconductor layer comprises one of a silicon semiconductor layer or an oxide semiconductor layer.

In some embodiments, the photosensitive detection unit further comprises a capacitor, the first transistor comprises a first source, a first drain, and a first gate disposed opposite to the first semiconductor layer, and the second transistor comprises a second source, a second drain, and a second gate disposed opposite to the second semiconductor layer; the capacitor is connected in series with the second gate and one of the second source or the second drain of the second transistor, and the lower electrode plate of the capacitor is electrically connected to one of the first source or the first drain of the first transistor.

In some embodiments, the first gate, the second gate and the lower electrode plate of the capacitor are arranged in a same layer, and the first source, the first drain, the second source, the second drain and the upper plate of the capacitor are arranged in a same layer, and the upper electrode plate is arranged opposite to the lower electrode plate.

In some embodiments, the photosensitive detection unit further comprises an integrator, an input terminal of the integrator is connected to one of the first source or the first drain of the first transistor, and the integrator is configured to output a signal according to the electrical signal.

In some embodiments, the display panel comprises a plurality of pixel units, and the photosensitive detection unit is located between two adjacent pixel units.

In some embodiments, each of the pixel units comprises a first sub-pixel, a second sub-pixel adjacent to the first sub-pixel, and a third sub-pixel adjacent to the second sub-pixel, and in a top view, the second transistor is located between two adjacent first sub-pixels, the capacitor is located between two adjacent second sub-pixels, and the first transistor is located between two adjacent third sub-pixels.

The present disclosure further provides a method for manufacturing a display panel, wherein the display panel comprises the following blocks:

Block S10: providing a substrate; and

Block S20: forming a second semiconductor layer and a first semiconductor layer on the surface of the substrate;

Wherein, the first semiconductor comprises a bismuth selenium oxide material, and the carrier mobility of the second semiconductor layer is less than or equal to the carrier mobility of the first semiconductor layer.

In some embodiments, the manufacturing method further comprises:

Block S30: forming a photosensitive layer on a surface of the second semiconductor layer.

In some embodiments, the block S20 further comprises:

Block S21: providing bismuth nitrate pentahydrate and ethylene glycol, and dissolving the bismuth nitrate pentahydrate in the ethylene glycol to form a uniform solution;

Block S22: depositing the solution on the surface of the substrate using inkjet printing technology to form a first reaction layer;

Block S23: heating and curing the first reaction layer to obtain a second reaction layer; and Block S24: performing selenization treatment on the second reaction layer to obtain the first semiconductor layer.

In some embodiments, the mass ratio of ethylene glycol to bismuth nitrate pentahydrate ranges from 50:1 to 100:1.

In some embodiments, the temperature during the heating and curing treatment ranged from 400° C. to 500° C., and the heating time ranges from 40 minutes to 120 minutes.

In some embodiments, the selenization treatment is carried out using hydrogen selenide gas at a temperature ranging from 300° C. to 400° C.

In some embodiments, the manufacturing material of the second semiconductor layer comprises one of monocrystalline silicon, polycrystalline silicon, amorphous silicon, zinc oxide, zinc tin oxide, indium oxide, titanium oxide, indium gallium zinc oxide or selenium bismuth oxide.

In some embodiments, the photosensitive layer comprises at least one of zinc oxide nanomaterials, perovskite nanomaterials, or photoresistors.

The present disclosure further provides a display device, comprising a display panel, and the display panel comprises a first transistor comprising a first semiconductor layer, and the first semiconductor layer comprises a bismuth selenium oxide material.

In some embodiments, the display panel comprises a light-sensing detection unit comprising:

a second transistor comprising a second semiconductor layer, and the second transistor is configured to convert an optical signal into an electrical signal; and the first transistor is configured to derive the electrical signal.

In some embodiments, the second transistor further comprises a photosensitive layer located on a side of the second semiconductor layer close to the light-emitting surface of the display panel, and the second semiconductor layer comprises one of silicon materials, oxide materials or bismuth selenium oxide materials.

Compared with the prior art, embodiments of the present disclosure provide a display panel, a manufacturing method thereof, and a display device. The display panel comprises a first transistor, the first transistor comprises a first semiconductor layer, and the first semiconductor layer comprises bismuth selenium oxide materials to enhance mobility of the first transistor and improve the electrical performance of the display panel, so that the display panel meets the requirements of high refresh rate and high transmittance.

DETAILED DESCRIPTION OF PREFERRED EMBODIMENTS

In order to make the purpose, technical solutions and effects of the present disclosure clearer, the following further describes the present disclosure in detail with reference to the drawings and embodiments. It should be understood that specific embodiments described herein are only used to explain the present disclosure, and not used to limit the present disclosure.

Figure 1A:
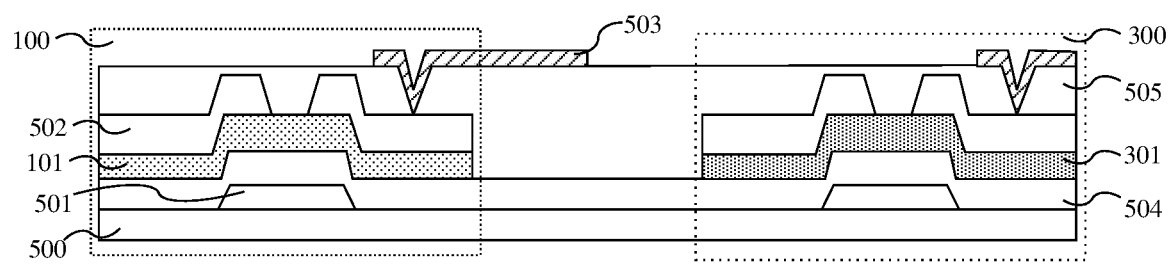
FIGS. 1A-1C are schematic structural diagrams of a display panel provided in embodiments of the present disclosure.
Figure 1B:
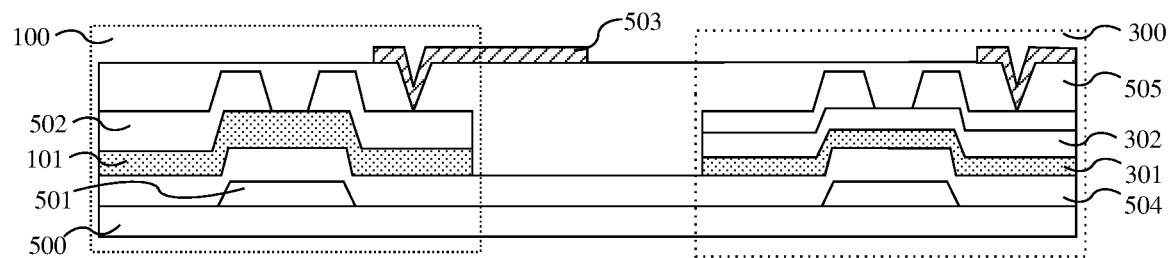
Figure 1C:
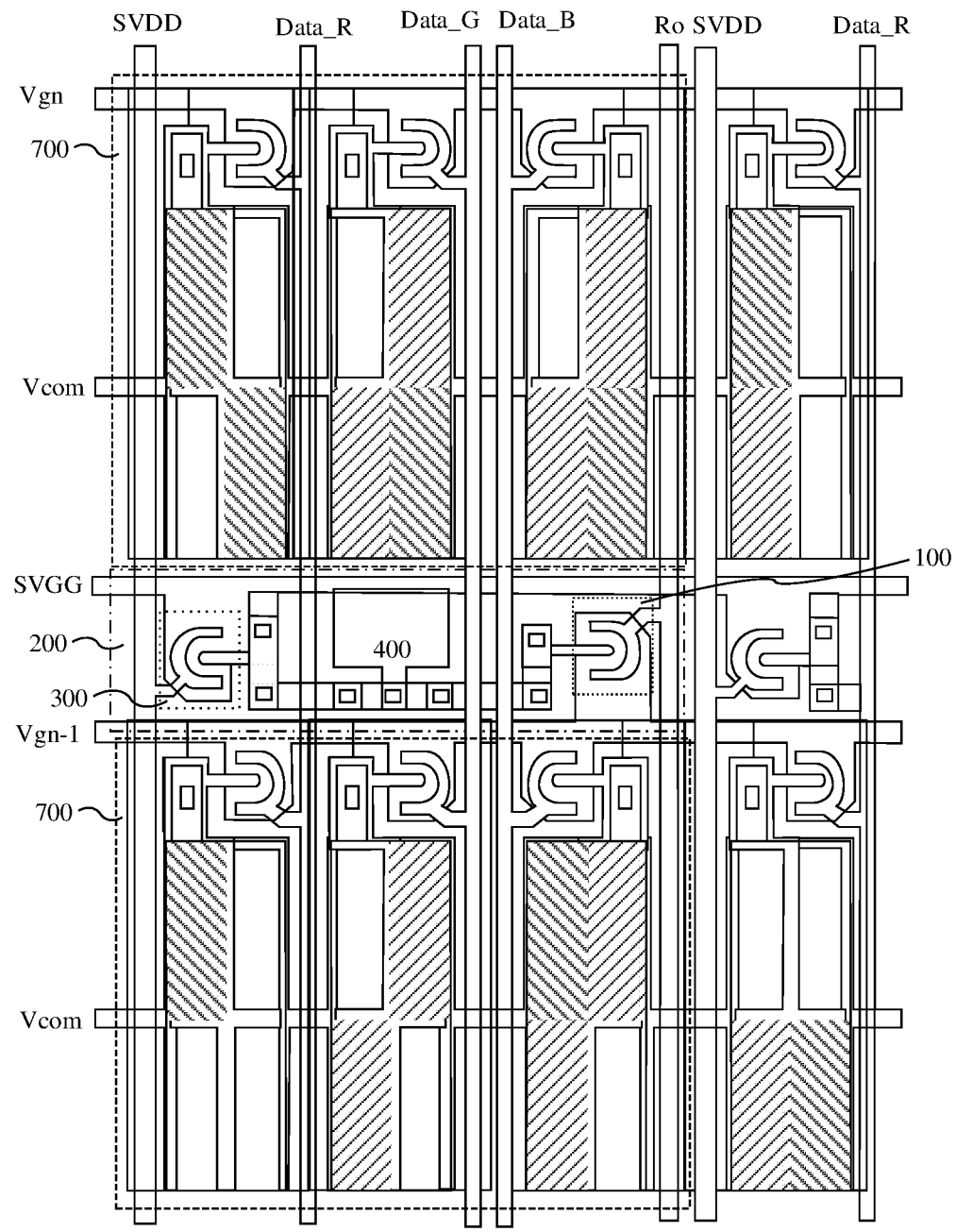
Figure 1D:
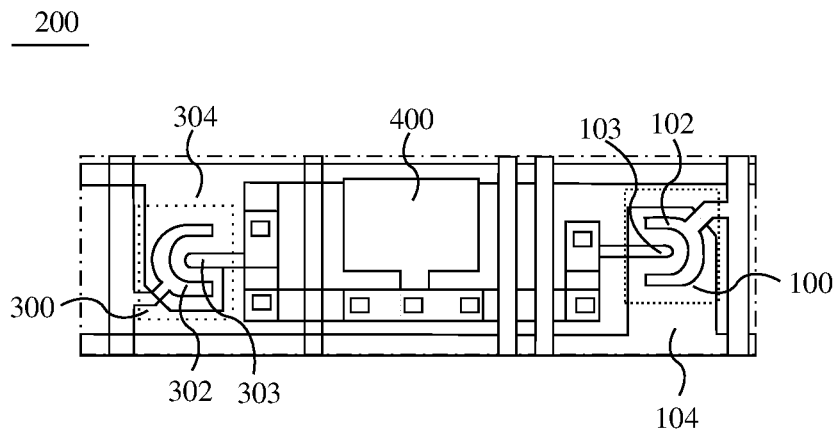
FIGS. 1D-1E are schematic structural diagrams of a photosensitive detection unit provided in the embodiments of the present disclosure.
Figure 1E:
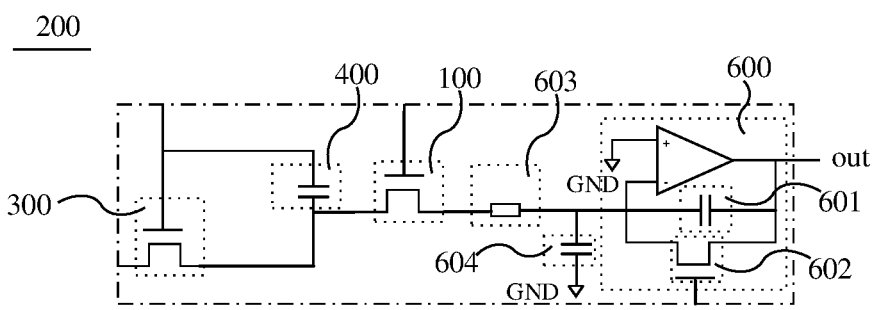

Please refer to FIGS. 1A-1C, which are schematic structural diagrams of a display panel provided in an embodiment of the present disclosure. As shown in FIGS. 1D-1E, which are schematic diagrams of a photosensitive detection unit provided in the embodiments of the present disclosure.

Specifically, an embodiment of the present disclosure provides a display panel, comprising a first transistor 100. The first transistor 100 comprises a first semiconductor layer 101 including a bismuth selenium oxide material to enhance mobility of the first transistor 100 and improve performance of the first transistor 100, thereby improving electrical performance of the display panel, so that the display panel meets requirements of high refresh rate, high transmittance, etc.

Further, the display panel comprises a photosensitive detection unit 200, and the photosensitive detection unit 200 comprises:

A second transistor 300 comprising a second semiconductor layer 301; the second transistor 300 is configured to convert an optical signal into an electrical signal; and The first transistor 100 is configured to derive the electrical signal, so that the display panel can realize functions such as fingerprint recognition, distance sensing, gesture recognition, and page flipping according to the electrical signal.

The second semiconductor layer 301 comprises one of a silicon semiconductor layer or an oxide semiconductor layer to realize sensing of optical signals of different wavelengths. Specifically, the silicon semiconductor layer includes amorphous silicon, polycrystalline silicon, single crystal silicon, etc., and the oxide semiconductor layer includes zinc oxide, zinc tin oxide, indium gallium zinc oxide, etc. In addition, the second semiconductor layer 301 may also include materials such as gallium nitride, germanium, silicon germanium, etc., to further broaden the wavelength range in which the second transistor 300 can sense light.

Since different semiconductor materials have different band gaps, the wavelength range of light that can be sensed by semiconductor layers of different materials will also be different. The wavelength $\lambda$ of light that can be sensed by semiconductor layers of different materials can be calculated by $\lambda = hc/Eg$ or estimated by $\lambda = 1240/Eg$, wherein h is Planck's constant, c is the speed of light, and Eg is the band gap.

Specifically, when the second semiconductor layer 301 is a silicon semiconductor layer including monocrystalline silicon, polycrystalline silicon, or amorphous silicon, since the band gap of monocrystalline silicon and polycrystalline silicon is about 1.12 eV, the band gap of amorphous silicon is about 1.8 eV, the second transistor 300 can sense visible light and infrared light. Similarly, when the second semiconductor layer 301 is an oxide semiconductor layer including indium gallium zinc oxide, since the band gap of indium gallium zinc oxide is about 3.3 eV, the second transistor 300 can sense ultraviolet light.

Further, the second transistor 300 further comprises a photosensitive layer 302 located on a side of the second semiconductor layer 301 close to the light-emitting surface of the display panel, and the second semiconductor layer 301 includes one of silicon, oxide, or selenium oxide bismuth materials to broaden the wavelength range of light that the second transistor 300 can sense.

Specifically, for example, when the second semiconductor layer 301 is an oxide semiconductor layer including indium gallium zinc oxide, by adding the photosensitive layer 302, the second transistor 300 can sense ultraviolet light and visible light, which widens the wavelength range of light that can be sensed by the second transistor 300, facilitates detection of light in a wider wavelength range, expands application range of the display panel, and improves applicability of the display panel.

In addition, due to high mobility of bismuth selenium oxide, when the first semiconductor layer 101 and the second semiconductor layer 301 both contain bismuth selenium oxide materials, electrical performance of the display panel can be improved while improving optical performance of the display panel.

The photosensitive layer 302 includes at least one of zinc oxide nanomaterials, perovskite nanomaterials, or photosensitive resistors.

Please continue to refer to FIGS. 1C-1E. The photosensitive detection unit 200 further comprises a capacitor 400. The first transistor 100 comprises a first source 102, a first drain 103, and a first gate 104 disposed corresponding to the first semiconductor layer 101 (shown in FIGS. 1A-1B). The second transistor 300 comprises a second source 302, a second drain 303, and a second gate 304 arranged corresponding to the second semiconductor layer 301 (shown in FIGS. 1A-1B). The capacitor 400 is connected in series between the second gate 304 and one of the second source 302 or the second drain 303 of the second transistor 300, and a lower electrode plate of the capacitor 400 is electrically connected to one of the first source 102 or the first drain 103 of the first transistor 100. The capacitor 400 is configured to accumulate electrons generated by the electrical signal, so as to facilitate the first transistor 100 to derive the electrical signal.

Further, the capacitor 400 is connected in series between the second gate 304 and the second drain 303 of the second transistor 300, and the lower electrode plate of the capacitor 400 is electrically connected to the first drain 103 of the first transistor 100.

The first gate 104, the second gate 304, and the lower electrode plate of the capacitor 400 are arranged in a same layer, and the first source 102, the first drain 103, the second source 302, the second drain electrode 303, and the upper electrode plate of the capacitor 400 are arranged in a same layer. The upper electrode plate is arranged opposite to the lower electrode plate to save manufacturing process.

Specifically, please continue to refer to FIGS. 1A-1E. The display panel comprises a substrate 500 and a first metal layer 501 and a second metal layer 502 on the substrate 500. The first metal layer 501 comprises the first gate 104, the second gate 304, and the lower electrode plate of the capacitor 400. The second metal layer 502 comprises the first source 102, the first drain 103, the second source 302, the second drain 303, and the upper electrode plate of the capacitor 400.

Further, the first metal layer 501 is located between the substrate 500, the first semiconductor layer 101, and the second semiconductor layer 301. The second metal layer 502 is located on a side of the first semiconductor layer 101 and the second semiconductor layer 301 away from the substrate 500.

Further, please continue to refer to FIGS. 1A-1C. The first metal layer 501 also comprises a first voltage wire SVGG electrically connected to the second gate 304 and a first control wire Vgn-1 electrically connected to the first gate 104 and parallel to the first voltage wire SVGG. The second metal layer 502 further comprises a second voltage wire SVDD connected to one of the second source 302 or the second drain 303 and a read signal wire Ro connected to one of the first source 102 or the first drain 103 and parallel to the second voltage wire SVDD.

In addition, the first metal layer 501 also comprises a second control wire Vgn and a common electrode wiring Vcom parallel to the first control wire Vgn-1. The second metal layer 502 also comprises data wires Data_R, Data_G, and Data_B parallel to the second voltage wire SVDD.

Further, please continue to refer to FIGS. 1D-1E. The photosensitive detection unit 200 further comprises an integrator 600. An input terminal of the integrator 600 is connected to one of the first source 102 or the first drain 103 of the first transistor 100. The integrator 600 is configured to output a signal out according to the electrical signal.

Specifically, one of the first source 102 or the first drain 103 of the first transistor 100 is connected to a negative input terminal of the integrator 600. The integrator 600 comprises a feedback capacitor 601 and a reset transistor 602.

After the second transistor 300 receives an optical signal and converts it into an electrical signal, the capacitor 400 accumulates electrons generated by the electrical signal and stores them in the capacitor 400. When the first transistor 100 turns on, the reset transistor 602 is turned off, and the integrator 600 accumulates the electrons originally accumulated in the storage capacitor in the feedback capacitor 601, so that an output of the integrator 600 changes with the electrons accumulated on the feedback capacitor 601. That is, the integrator 600 outputs the signal out according to the electrical signal.

Further, the photosensitive detection unit 200 further comprises a filter located between the first transistor 100 and the integrator 600. Specifically, the filter comprises a resistor 603 connected in series between one of the first source 102 or the first drain 103 of the first transistor 100 and the input terminal of the integrator 600, as well as a first capacitor 604 connected in series between the input terminal of the integrator 600 and a low-level voltage terminal GND.

The optical signal comprises light projected from outside to the display panel (such as from a laser pointer, an air pen, etc.) and also comprises light emitted by each pixel in the display panel that is blocked by an object and reflected onto the display panel. The electrical signal is a current signal. The signal out output by the integrator 600 can be sent to a controller, and the controller collects the output signals out corresponding to a plurality of the photosensitive detection units 200 to recognize fingerprints, gestures, positions, motion tracks, etc., so that the display panel realizes functions such as fingerprint recognition, gesture recognition, distance sensing, page turning, remote writing, electronic game interactions, etc.

In addition, the display panel may further comprise a sensing unit for sensing signals such as gas, humidity, and temperature, so that the display panel can realize functions such as gas sensing, humidity sensing, and heat sensing. Specifically, the display panel further comprises a third transistor, and the third transistor comprises a third semiconductor layer. Further, the third semiconductor layer comprises materials such as zinc oxide, zinc tin oxide, titanium oxide, aluminum oxide, germanium, etc. In addition, the third transistor further comprises one of a gas sensitive layer, a humidity sensitive layer, a heat sensitive layer, etc. The third semiconductor layer comprises materials such as zinc oxide, zinc tin oxide, titanium oxide, aluminum oxide, germanium, selenium bismuth oxide, etc. The gas sensitive layer comprises a gas sensitive resistor, etc. The humidity sensitive layer includes a humidity sensitive resistor, etc. The heat-sensitive layer comprises a thermistor, etc.

Please continue to refer to FIGS. 1A-1C, the display panel comprises a plurality of pixel units 700, and the photosensitive detection unit 200 is located between two adjacent pixel units 700, so that the display panel can have higher sensitivity characteristics to improve sensing accuracy. The pixel unit 700 comprises a plurality of sub-pixels, and light-emitting colors of the sub-pixels comprise red, blue, green, white, etc.

Further, each pixel unit 700 comprises a first sub-pixel, a second sub-pixel adjacent to the first sub-pixel, and a third sub-pixel adjacent to the second sub-pixel. In a top view, the second transistor 300 is located between two adjacent first sub-pixels, the capacitor 400 is located between two adjacent second sub-pixels, and the first transistor 100 is located between two adjacent third sub-pixels, to increase plate area of the capacitor 400 and capacitance of the capacitor 400, so that the second transistor 300 is more stable during operation.

Please continue to refer to FIGS. 1A-1D. The display panel further comprises a first electrode 503 located on the side of the second metal layer 502 away from the substrate 100, and the first electrode 503 includes a sub-pixel and an electrical connection part. The electrical connection part is used to realize electrical connection between one of the first source 102 or the first drain 103 and one of the second source 302 or the second drain 303.

Specifically, please continue to refer to FIGS. 1A-1B and 1D. The electrical connection between the second drain 303 of the second transistor 300 and the lower electrode plate of the capacitor 400 is realized by switching wires in the first electrode 503 and wires in the first metal layer 501. That is, when the second metal layer 502 comprises the second drain 303 and the first metal layer 501 comprises the lower electrode plate of the capacitor 400, the second drain 303 is electrically connected to the first electrode 503 (i.e., the electrical connection part) through a via hole in the protection layer 505, and then in an area intersecting the data line Data_R, the electrical connection between the first electrode 503 and the first metal layer 501 is realized through the via hole in the protection layer 505. When electrically connected to the lower electrode plate of the capacitor 400, wires in first metal layer 501 is switched to the wires in the first electrode 503 (i.e., the electrical connection part) to achieve electrical connection between the second drain 303 and the lower electrode plate of the capacitor 400.

Similarly, electrical connection between the first drain 103 of the first transistor 100 and the lower electrode plate of the capacitor 400 is realized by switching the wires between the first electrode 503 and the first metal layer 501. That is, when the second metal layer 502 comprises the first drain 103, and the first metal layer 501 comprises the lower electrode plate of the capacitor 400, the first drain 103 is electrically connected to the first electrode 503 (i.e., the electrical connection part) through the via hole in the protection layer 505, and then in the area intersecting the data lines Data_G and Data_B, the electrical connection between the first electrode 503 and the first metal layer 501 is realized through the via hole in the protection layer 505. When electrically connected to the lower electrode plate of the capacitor 400, the wires in the first metal layer 501 is switched to the wires in the first electrode 503 (i.e., the electrical connection part) to achieve electrical connection between the first drain 103 and the lower electrode plate of the capacitor 400, thereby realizing the electrical connection between the first drain 103 and the second drain 303.

Further, the display panel comprises a light-emitting device, and the light-emitting device includes an anode, a cathode, and a light-emitting layer located between the anode and the cathode. Wherein, the anode of the light-emitting device may be composed of the first electrode 503. The light-emitting device includes one of an organic light-emitting diode, a submillimeter light-emitting diode or a miniature light-emitting diode.

In addition, the display panel further comprises: an insulating layer 504 located between the first metal layer 501 and the first semiconductor layer 101 and the second semiconductor layer 301; and the protection layer 505 located between the first electrode 503 and the second metal layer 502, and other parts not shown. The first electrode 503 is electrically connected to one of the first source 102 or the first drain 103 of the first transistor 100 and one of the second source 302 or the second drain 303 through the via hole in the protective layer 505.

In the display panels shown in FIGS. 1A-1B, the first transistor 100 and the second transistor 300 are used as bottom-gate structures. Those skilled in the art can also use top-gate, double-gate, etc. The structure of the transistor is not repeated here.

It can be understood that the display panel may also be a liquid crystal display panel, and further, the first electrode 503 may constitute a pixel electrode. Furthermore, the display panel also includes a color filter substrate and a polarizer, etc., which will not be repeated here.

Figure 2A:
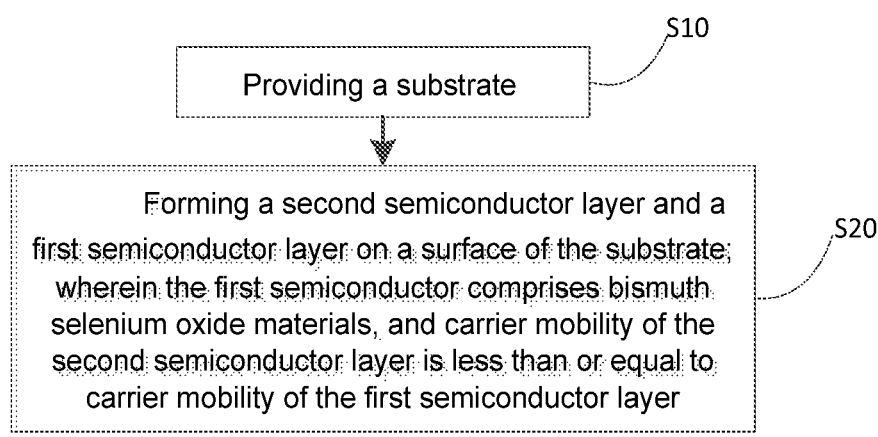
FIGS. 2A-2B are flowcharts for manufacturing the display panel provided in the embodiments of the present disclosure.
Figure 2B:
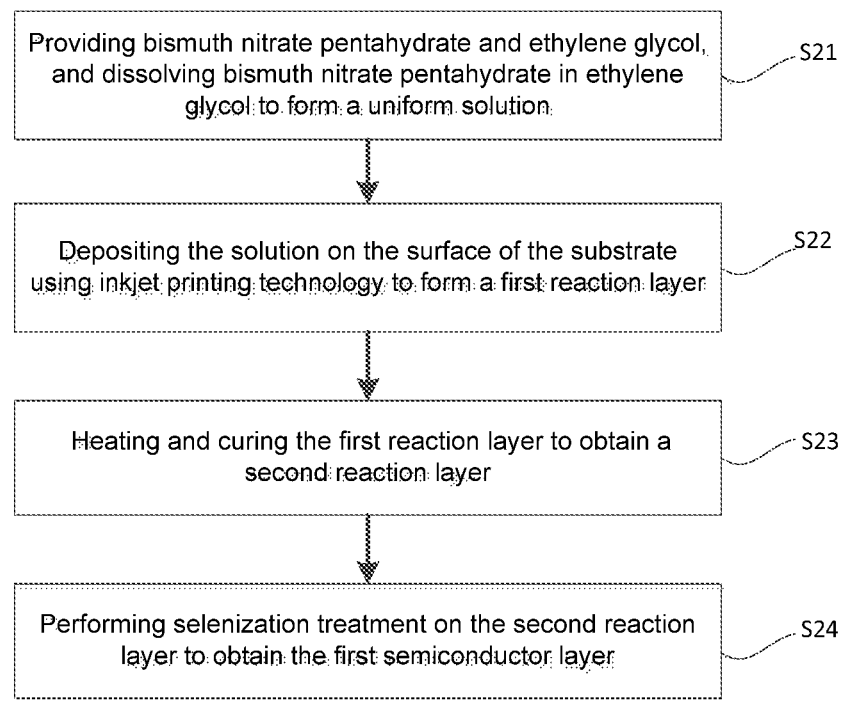

Please refer to FIGS. 2A-2B, which are flowcharts for manufacturing the display panel provided in embodiments of the present disclosure. The present disclosure also provides a manufacturing method of the display panel, which comprises the following blocks:

Block S10: providing a substrate;
Block S20: forming a first semiconductor layer and a second semiconductor layer on the surface of the substrate;

Wherein, the first semiconductor comprises a bismuth selenium oxide material, and carrier mobility of the second semiconductor layer is less than or equal to carrier mobility of the first semiconductor layer.

Specifically, the block S20 further comprises:
Block S21: providing bismuth nitrate pentahydrate and ethylene glycol, and dissolving bismuth nitrate pentahydrate in ethylene glycol to form a uniform solution;
Block S22: preparing the solution on the surface of the substrate using inkjet printing technology to form a first reaction layer;
Block S23: heating and curing the first reaction layer to obtain a second reaction layer;
Block S24: performing selenization treatment on the second reaction layer to obtain the first semiconductor layer.

Wherein, the mass percentage of ethylene glycol and bismuth nitrate pentahydrate ranges from 50:1-100:1, the temperature during the heating and curing treatment ranges from 400° C. to 500° C., the heating time ranges from 40 minutes to 120 minutes, and the selenization treatment is realized by using hydrogen selenide gas at 300° C.-400° C.

That is, bismuth nitrate pentahydrate $Bi(NO_3)_3 \cdot 5H_2O$ is dissolved in ethylene glycol $(CH_2OH)_2$ to form a uniform solution, and the solution is uniformly coated on the surface of the substrate to form a first reaction layer; then, the first reaction layer is heated and cured in an environment of 400° C.-500° C., and the heating time is 40 minutes to 120 minutes, so that the first reaction layer reacts, thereby forming the second reaction layer ($Bi(NO_3)_3 \cdot 5H_2O = BiONO_3 + 2HNO_3 + 4H_2O$; $2BiONO_3 = Bi_2O_3 + NO + NO_2 + O_2$). That is, the second reaction layer is a bismuth oxide layer ($Bi_2O_3$). Finally, the second reaction layer is pretreated at a temperature of 200° C., and then hydrogen selenide gas ($H_2Se$) is used to perform selenization treatment on the second reaction layer in an environment of 300° C.-400° C. to obtain the first semiconductor layer. That is, the selenization treatment triggers a ($Bi_2O_3 + H_2Se = Bi_2O_2Se + H_2O$) reaction of the second reaction layer, from which the first semiconductor layer is obtained. The use of inkjet printing technology to form the first semiconductor layer including the bismuth selenium oxide material can facilitate industrialization of the bismuth selenium oxide material.

Further, the manufacturing method further comprises:
Block S30: forming a photosensitive layer on the surface of the second semiconductor layer.

Wherein, the photosensitive layer comprises at least one of zinc oxide nanomaterials, perovskite nanomaterials, or photoresistors. The preparation material of the second semiconductor layer comprises one of monocrystalline silicon, polycrystalline silicon, amorphous silicon, zinc oxide, zinc tin oxide, zinc indium oxide, indium oxide, titanium oxide, indium gallium zinc oxide, indium zinc tin oxide, bismuth selenium oxide, etc.

When the first semiconductor layer and the second semiconductor layer both include bismuth selenium oxide material, the first semiconductor layer and the second semiconductor layer can be formed simultaneously to reduce the manufacturing process. When the preparation materials of the first semiconductor layer and the second semiconductor layer are different, the first semiconductor layer and the second semiconductor layer can be formed step by step. That is, the first semiconductor layer can be formed first, and then the region to be prepared for the second semiconductor layer can be covered by photoresist materials. After the formation of the first semiconductor layer is completed, the photoresist corresponding to the region to be prepared for the second semiconductor layer is removed, and then the second semiconductor layer is formed.

In addition, before forming the first semiconductor layer and the second semiconductor layer, a patterned first metal layer and an insulating layer are also formed on the surface of the substrate. The first metal layer comprises a first gate arranged in alignment with the first semiconductor layer and a second gate arranged in alignment with the second semiconductor layer.

Further, the manufacturing method further comprises:

Block S40: forming a second metal layer on the surface of the first semiconductor layer and on the surface of the second semiconductor layer or on the photosensitive layer, and patterning the second metal layer; the second metal layer comprises a first source and a first drain electrically connected to the first semiconductor layer and a second source and a second drain electrically connected to the second semiconductor layer;

Block S50: forming a protection layer and a first electrode on the surface of the second metal layer and the surface of the insulating layer, wherein the first electrode is electrically connected to one of the first source or the first drain and one of the second source or the second drain through the via hole in the protection layer.

Further, the forming method further comprises the blocks of forming an encapsulation layer, etc., which will not be repeated here. It is understandable that the first metal layer and the insulating layer can also be located on the side of the first semiconductor layer and the second semiconductor layer away from the substrate, and the insulating layer is located between the first metal layer, the first semiconductor layer, and the second semiconductor layer. The second metal layer is located on the side of the first metal layer away from the first semiconductor layer and the second semiconductor layer. The insulating layer is also formed between the second metal layer and the first metal layer. The first source and the first drain are electrically connected to the first semiconductor layer through a via hole on the insulating layer. The second source and the second drain are electrically connected to the second semiconductor layer through the via hole on the insulating layer.

The present disclosure further comprises a display device, which comprises the above-mentioned display panel and the display panel manufactured through the above display panel manufacturing method.

Further, the display device further comprises a touch panel, which is combined with the display panel in an external or built-in configuration to realize the touch function of the display panel.

The display device comprises a flexible display device, a mobile display device, etc. Specifically, the display device comprises a projector, a mobile phone, a computer, a bracelet, a game console, etc.

Embodiments of the present disclosure provide a display panel, a manufacturing method thereof, and a display device. The display panel comprises a first transistor. The first transistor comprises a first semiconductor layer, and the first semiconductor layer comprises bismuth selenium oxide materials to enhance mobility of the first transistor and improve the electrical performance of the display panel, so the display panel meets the requirements of high refresh rate and high transmittance.

In the above-mentioned embodiments, the description of each embodiment has its own focus. For parts that are not described in detail in an embodiment, reference may be made to related descriptions of other embodiments. Specific examples are used in this article to illustrate the principles and implementation of the present disclosure. The descriptions of the above examples are only used to help understand the technical solutions and core ideas of the present disclosure; those of ordinary skill in the art should understand: the technical solutions recorded in the foregoing embodiments are modified, or some of the technical features thereof are equivalently replaced; these modifications or replacements do not cause the essence of the corresponding technical solutions to deviate from the scope of the technical solutions of the embodiments of the present disclosure.

What is claimed is:

1. A display panel, comprising a plurality of photosensitive detection units and a plurality of pixel units;
    each pixel unit comprising a first sub-pixel, a second sub-pixel adjacent to the first sub-pixel, and a third sub-pixel adjacent to the second sub-pixel;
    each photosensitive detection unit comprising a first transistor configured to derive the electrical signal, a second transistor configured to convert an optical signal into an electrical signal, and a capacitor configured to accumulate electrons generated by the electrical signal, the first transistor comprising a first semiconductor layer, the first semiconductor layer comprising bismuth selenium oxide materials, and the second transistor comprising a second semiconductor layer;
    wherein in a top view, the second transistor is located between two adjacent first sub-pixels, the capacitor is located between two adjacent second sub-pixels, and the first transistor is located between two adjacent third sub-pixels.

2. The display panel of claim 1, wherein the second transistor further comprises a photosensitive layer located on a side of the second semiconductor layer close to a light-emitting surface of the display panel, and the second semiconductor layer comprises one of silicon materials, oxide materials, or bismuth selenium oxide materials.

3. The display panel of claim 1, wherein the second semiconductor layer comprises one of a silicon semiconductor layer or an oxide semiconductor layer.

4. The display panel of claim 1, wherein the photosensitive detection unit further comprises a capacitor; the first transistor comprises a first source, a first drain, and a first gate disposed opposite to the first semiconductor layer; and the second transistor comprises a second source, a second drain, and a second gate disposed opposite to the second semiconductor layer, wherein the capacitor is connected in series with the second gate and one of the second source or the second drain of the second transistor, and the lower electrode plate of the capacitor is electrically connected to one of the first source or the first drain of the first transistor.

5. The display panel of claim 4, wherein the first gate, the second gate, and the lower electrode plate of the capacitor are arranged in a same layer; the first source, the first drain, the second source, the second drain, and the upper electrode plate of the capacitor are arranged in a same layer; and the upper electrode plate is arranged opposite to the lower electrode plate.

6. The display panel of claim 4, wherein the photosensitive detection unit further comprises an integrator, an input terminal of the integrator is connected to one of the first source or the first drain of the first transistor, and the integrator is configured to output a signal according to the electrical signal.

7. The display panel of claim 4, wherein the display panel comprises a plurality of pixel units, and the photosensitive detection unit is located between two adjacent pixel units.

8. A method for manufacturing a display panel, comprising the following blocks:
   Block S10: providing a substrate; and
   Block S20: forming a second semiconductor layer and a first semiconductor layer on a surface of the substrate; and
   Block S30: forming a photosensitive layer on a surface of the second semiconductor layer;
   wherein the first semiconductor comprises bismuth selenium oxide materials, and carrier mobility of the second semiconductor layer is less than or equal to carrier mobility of the first semiconductor layer.

9. The manufacturing method of claim 8, wherein the block S20 further comprises:
   Block S21: providing bismuth nitrate pentahydrate and ethylene glycol, and dissolving the bismuth nitrate pentahydrate in the ethylene glycol to form a uniform solution;
   Block S22: depositing the solution on the surface of the substrate using inkjet printing technology to form a first reaction layer;
   Block S23: heating and curing the first reaction layer to obtain a second reaction layer; and
   Block S24: performing selenization treatment on the second reaction layer to obtain the first semiconductor layer.

10. The manufacturing method of claim 9, wherein the mass ratio of ethylene glycol to bismuth nitrate pentahydrate ranges from 50:1 to 100:1.

11. The manufacturing method of claim 9, wherein the temperature during the heating and curing treatment ranges from 400° C. to 500° C., and the heating time ranges from 40 minutes to 120 minutes.

12. The manufacturing method of claim 9, wherein the selenization treatment is carried out using hydrogen selenide gas at a temperature ranging from 300° C. to 400° C.

13. The manufacturing method of claim 8, wherein the manufacturing material of the second semiconductor layer comprises one of monocrystalline silicon, polycrystalline silicon, amorphous silicon, zinc oxide, zinc tin oxide, indium oxide, titanium oxide, indium gallium zinc oxide, or selenium bismuth oxide.

14. The manufacturing method of claim 8, wherein the photosensitive layer comprises at least one of zinc oxide nanomaterials, perovskite nanomaterials, or photoresistors.

15. A display device, comprising a display panel, and the display panel comprises a plurality of photosensitive detection units and a plurality of pixel units;
   each pixel unit comprises a first sub-pixel, a second sub-pixel adjacent to the first sub-pixel, and a third sub-pixel adjacent to the second sub-pixel;
   each photosensitive detection unit comprises a first transistor configured to derive the electrical signal, a second transistor configured to convert an optical signal into an electrical signal, and a capacitor configured to accumulate electrons generated by the electrical signal, the first transistor comprises a first semiconductor layer, the first semiconductor layer comprises bismuth selenium oxide materials, and the second transistor comprises a second semiconductor layer;
   wherein in a top view, the second transistor is located between two adjacent first sub-pixels, the capacitor is located between two adjacent second sub-pixels, and the first transistor is located between two adjacent third sub-pixels.

16. The display device of claim 15, wherein the second transistor further comprises a photosensitive layer located on a side of the second semiconductor layer close to a light-emitting surface of the display panel, and the second semiconductor layer comprises one of silicon materials, oxide materials, or bismuth selenium oxide materials.

* * * * *